US009945906B2

(12) United States Patent
Schnizler et al.

(10) Patent No.: US 9,945,906 B2
(45) Date of Patent: *Apr. 17, 2018

(54) TEST DEVICE AND METHOD

(71) Applicant: VIAVI SOLUTIONS DEUTSCHLAND GMBH, Eningen (DE)

(72) Inventors: Reiner Schnizler, Beuren (DE); Paul Brooks, Ofterdingen (DE)

(73) Assignee: VIAVI SOLUTIONS DEUSTSCHLAND GMBH, Eningen Unter Achalm (DE)

(*) Notice: Subject to any disclaimer, the term of this patent is extended or adjusted under 35 U.S.C. 154(b) by 47 days.

This patent is subject to a terminal disclaimer.

(21) Appl. No.: 14/960,184

(22) Filed: Dec. 4, 2015

(65) Prior Publication Data
US 2016/0084907 A1  Mar. 24, 2016

Related U.S. Application Data

(63) Continuation of application No. 14/194,301, filed on Feb. 28, 2014, now Pat. No. 9,229,831.

(60) Provisional application No. 61/771,620, filed on Mar. 1, 2013.

(51) Int. Cl.
G06F 11/00        (2006.01)
G01R 31/317       (2006.01)
H04L 12/26        (2006.01)
G06F 11/273       (2006.01)
H04L 1/24         (2006.01)
G01R 31/3177      (2006.01)

(52) U.S. Cl.
CPC ... *G01R 31/31718* (2013.01); *G01R 31/3177* (2013.01); *G06F 11/2733* (2013.01); *H04L 1/243* (2013.01); *H04L 43/50* (2013.01)

(58) Field of Classification Search
CPC .................................................. G06F 11/2733
USPC .................. 714/27, 30, 31, 733, 734, 735
See application file for complete search history.

(56) References Cited

U.S. PATENT DOCUMENTS

2006/0189220 A1    8/2006  Duval et al.
2009/0112548 A1    4/2009  Conner
2009/0113245 A1    4/2009  Conner
2010/0235135 A1    9/2010  Conner
2013/0138383 A1*   5/2013  Filler ............... G06F 11/263
                                                 702/123

FOREIGN PATENT DOCUMENTS

WO    2011/149725    12/2011

OTHER PUBLICATIONS

CFP MSA Hardware Specification, Revision 1.4, Jun. 7, 2010.
CFP MSA CFP2 Hardware Specification, Revision 1.0, Jul. 31, 2013.
CFP MSA Management Interface Specification, Version 2.0 r09, Apr. 10, 2012.

(Continued)

Primary Examiner — Dieu-Minh Le
(74) Attorney, Agent, or Firm — Mannava & Kang, P.C.

(57) ABSTRACT

A test device for testing a device under test (DUT) includes an integrated control interface adaptable for a plurality of different communication standards. The integrated control interface can be adapted to be compliant with the communication standard used by a DUT connected to the test device.

15 Claims, 6 Drawing Sheets

(56) References Cited

OTHER PUBLICATIONS

CFP MSA Management Interface Specification, Version 2.2 r06a, Jul. 31, 2013.
OIF, Implementation Agreement for 1000 Long-Haul DWDM Transmission Module-Electromechanical (MSA-1 OOGLH), Revision 1.1, Sep. 20, 2011.
Clause 45 of the "IEEE Standard for Ethernet", IEEE Std 802.3-2012, Dec. 28, 2012.

* cited by examiner

| MDIO and Non-MDIO Control Signals |||||
|---|---|---|---|
| Signal | Description | Direction | Type |
| PRG_CNTL1 | Programmable control 1 | Out | Non-MDIO |
| PRG_CNTL2 | Programmable control 2 | Out | |
| PRG_CNTL3 | Programmable control 3 | Out | |
| PM_SYNC | Performance monitoring sync | Out | |
| TX_DIS | Transmitter disable | Out | |
| MOD_LOPWR | Module low power | Out | |
| MOD_RSTn | Module reset | Out | |
| PRG_ALRM1 | Programmable alarm 1 | In | |
| PRG_ALRM2 | Programmable alarm 2 | In | |
| PRG_ALRM3 | Programmable alarm 3 | In | |
| MOD_ABS | Module absent | In | |
| RX_LOS | Receiver loss of signal | In | |
| GLB_ALRMn | Global alarm | In | |
| MDIO | MDIO serial data | Bidirectional | MDIO |
| MDC | MDIO clock | Out | |
| PRTADR0 | MDIO physical port address bit 1 | Out | |
| PRTADR1 | MDIO physical port address bit 2 | Out | |
| PRTADR2 | MDIO physical port address bit 3 | Out | |
| PRTADR3 | MDIO physical port address bit 4 | Out | |
| PRTADR4 | MDIO physical port address bit 5 | Out | |

FIG. 2

TEST DEVICE AND METHOD

CROSS-REFERENCE TO RELATED APPLICATIONS

This application is a continuation of U.S. patent application Ser. No. 14/194,301 filed Feb. 28, 2014, now U.S. Pat. No. 9,229,831, which claims priority to U.S. Provisional Patent Application Ser. No. 61/771,620, filed on Mar. 1, 2013, both of which are incorporated by reference in their entireties.

TECHNICAL FIELD OF THE INVENTION

The present invention relates to a test device for testing a device under test (DUT) having a control interface compliant with a standard supporting management data input/output (MDIO) and non-MDIO control signals, and more particularly, to a test device comprising an integrated control interface. The present invention also relates to a method of testing such a DUT by using such a test device.

BACKGROUND OF THE INVENTION

As network traffic demands increase, new transmission devices, e.g., transceivers, transponders, and transmission modules, are required to support higher data transfer rates, e.g., 40 Gbps and 100 Gbps. Accordingly, new test devices are needed for validation and testing of these transmission devices.

Transmission devices supporting higher data transfer rates have been developed in compliance with various standards defined by multiple source agreements (MSAs). For example, the C form factor pluggable (CFP) MSA defines CFP, CFP2, and CFP4 standards for hot-pluggable optical transceivers supporting data transfer rates of 40 Gbps and 100 Gbps. Documents relating to the CFP MSA include the "CFP MSA Hardware Specification", Revision 1.4, Jun. 7, 2010, the "CFP MSA CFP2 Hardware Specification", Revision 1.0, Jul. 31, 2013, and the "CFP MSA Management Interface Specification", Version 2.0 r09, Apr. 10, 2012, and Version 2.2 r06a, Jul. 31, 2013, all of which are incorporated herein by reference. The Optical Internetworking Forum (OIF) MSA for a 100 Gbps long-haul (100GLH) transmission module defines an OIF-MSA-100GLH standard for board-mounted optical transmission modules supporting a data transfer rate of 100 Gbps, Documents relating to the OIF-MSA-100GLH include "Implementation Agreement for 100G Long-Haul DWDM Transmission Module—Electromechanical (MSA-100GLH)", Revision 1.1, Sep. 20, 2011, which is incorporated herein by reference.

All of the CFP, CFP2, CFP4, and OIF-MSA-100GLH standards specify the use of the management data input/output (MDIO) interface, as defined in Clause 45 of the "IEEE Standard for Ethernet", IEEE Std 802.3-2012, Dec. 28, 2012, which is incorporated herein by reference. These standards also specify the use of similar sets of non-MDIO control signals, i.e., direct control signals.

With reference to FIG. 1, a conventional test device 100 for testing such transmission devices does not provide direct control of a transmission device as a device under test (DUT) 150. The conventional test device 100 includes a test interface 110 and a remote control interface 120. However, the conventional test device 100 does not include an integrated control interface for directly controlling the DUT 150 via MDIO and non-MDIO control signals. Rather, the DUT 150 is indirectly controlled by an external control device 160.

In the test setup of FIG. 1, the remote control interface 120 of the test device 100 is coupled to the external control device 160, e.g., a computer running control software, and the test interface 110 of the test device 100 is coupled to a data interface 151 of the DUT 150. The external control device 160 has control over the control plane. The external control device 160 is coupled to a conversion device 170, which is coupled to a control interface 152 of the DUT 150. The conversion device 170 is required to convert control signals, e.g., universal serial bus (USB) signals, provided by the external control device 160 to MDIO and non-MDIO control signals supported by the DUT 150.

Unfortunately, in the test setup of FIG. 1, it is difficult to synchronize control transactions between the external control device 160 and control interface 152 of the DUT 150 with test data transactions between the test interface 110 of the test device 100 and data interface 151 of the DUT 150. Synchronization is possible with limited precision only and, usually, requires running complex real-time control software on the external control device 160. It is also difficult to correlate test results obtained by the test interface 110 of the test device 100 with status information about the DUT 150 obtained by the external control device 160, because the timing of test events is only precisely known within the test device 100.

Therefore, an improved test device and method are desirable.

SUMMARY OF THE INVENTION

Accordingly, one aspect of the present invention relates to a method of testing a device under test (DUT) having a control interface compliant with a standard selected from a plurality of standards each supporting a common set of management data input/output (MDIO) and non-MDIO control signals, the method comprising: coupling the DUT to a test device comprising a test interface and an integrated control interface, by coupling a data interface of the DUT to the test interface of the test device, and by coupling the control interface of the DUT to the integrated control interface of the test device; adapting the integrated control interface of the test device to the standard with which the control interface of the DUT complies, so that the integrated control interface of the test device directly and fully controls the DUT via at least the common set of MDIO and non-MDIO control signals; performing a test on the DUT, by exchanging test data signals between the data interface of the DUT and the test interface of the test device, to obtain test results; and monitoring the DUT throughout the test, by exchanging control signals selected from the common set of MDIO and non-MDIO control signals between the control interface of the DUT and the integrated control interface of the test device, to obtain status information about the DUT.

Another aspect of the present invention relates to a test device for testing a DUT having a control interface compliant with a standard selected from a plurality of standards each supporting a common set of MDIO and non-MDIO control signals, the test device comprising: a test interface for coupling to a data interface of the DUT; and for exchanging test data signals with the data interface of the DUT to perform a test on the DUT and thereby obtain test results; and an integrated control interface for coupling to the control interface of the DUT; for adapting to the standard with which the control interface of the DUT complies, so that the integrated control interface directly and fully controls the DUT via at least the common set of MDIO and non-MDIO control signals; and for exchanging control signals selected from the common set of MDIO and non-MDIO control signals with the control interface of the DUT to monitor the DUT throughout the test and thereby obtain status information about the DUT.

BRIEF DESCRIPTION OF THE DRAWINGS

The present invention will be described in greater detail with reference to the accompanying drawings wherein:

FIG. 2 is table of management data input/output (MDIO) and non-MDIO control signals supported by an exemplary embodiment of a test device according to the present invention;

DETAILED DESCRIPTION OF THE INVENTION

Figure 1:
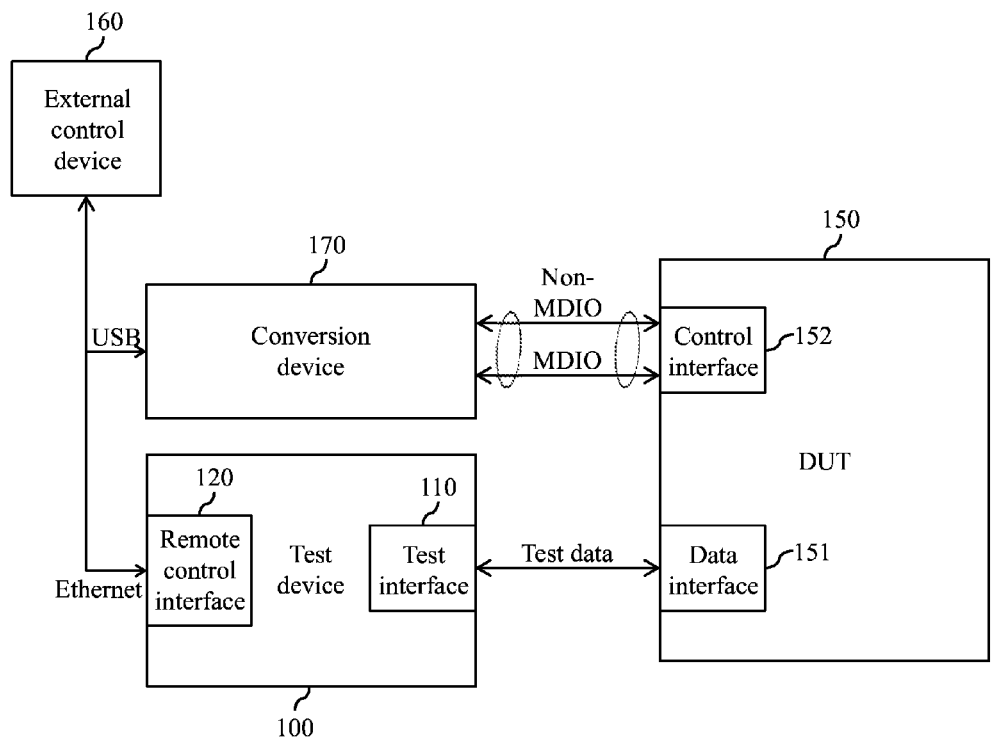
FIG. 1 is a block diagram of a test setup using a conventional test device.

The present invention provides a test device for testing a device under test (DUT) having a control interface compliant with a standard selected from a plurality of standards each supporting a common set of management data input/output (MDIO) and non-MDIO control signals, and a method of testing such a DUT by using such a test device.

The test device of the present invention provides direct and full control of the DUT via MDIO and non-MDIO control signals. Advantageously, this capability often eliminates the need for an external control device, e.g., a computer running control software, and avoids synchronization difficulties between the test device and such an external control device. Moreover, this capability often eliminates the need for a conversion device, e.g., a universal serial bus (USB) to MDIO converter and/or a USB to low-voltage transistor-transistor logic (LVTTL) converter for the non-MDIO control signals. The test device is often capable of performing automated tests on the DUT and correlating test results with status information about the DUT.

The test device is capable of testing different types of DUTs having different form factors, power dissipation characteristics, and application spaces. The DUT is often a transmission device, such as a transceiver, a transponder, or a transmission module. For example, the DUT may be a CFP, CFP2, or CFP4 transceiver or transponder, or an OIF-MSA-100GLH transmission module. Alternatively, the DUT may be an integrated circuit (IC), e.g., a gearbox, a test board, a subsystem, or a complete system.

In general, the test device is capable of testing any DUT having a control interface that is compliant with a standard selected from a plurality of standards, e.g., at least 3 standards, each supporting a common set of MDIO and non-MDIO control signals, e.g., at least 6 common non-MDIO control signals. For example, the plurality of standards may include the CFP, CFP2, and CFP4 standards, which each support an MDIO interface and 6 common non-MDIO control signals, as explained in further detail hereafter.

In an exemplary embodiment of the test device, the plurality of standards includes the CFP, CFP2, CFP4, and OIF-MSA-100GLH standards, which each support a common set of MDIO and non-MDIO control signals, as explained in further detail hereafter. Accordingly, any DUT having a control interface compliant with one of these standards may be tested by using the test device. Of course, additional standards, e.g., 400G standards, supporting the common set of MDIO and non-MDIO control signals may be developed in the future, allowing the testing of DUTs having control interfaces compliant with those standards.

The CFP, CFP2, CFP4, and OIF-MSA-100GLH standards specify the use of similar MDIO and non-MDIO control signals. MDIO and non-MDIO control signals used by the standards are tabulated in FIG. 2.

The MDIO control signals include an MDIO serial data signal (MDIO) and an MDIO clock signal (MDC), which are supported by all of the standards. The MDIO control signals also include MDIO physical port address signals (PRTADRx), which differ in number depending on the standard. The CFP and OIF-MSA-100GLH standards each support 5 MDIO physical port address signals, whereas the CFP2 and CFP4 standards support only 3 MDIO physical port address signals.

The non-MDIO control signals are direct control signals, i.e., hardware control signals, including output control signals and input monitoring signals. The OIF-MSA-100GLH standard supports all of the non-MDIO control signals tabulated in FIG. 2. However, the performance monitoring sync signal (PM_SYNC) is only supported by the OIF-MSA-100GLH standard and is optional for the OIF-MSA-100GLH standard. Therefore, in some embodiments, this signal may not be supported by the test device. The CFP and CFP2 standards support all of the non-MDIO control signals tabulated in FIG. 2, except for the performance monitoring sync signal. The CFP4 standard supports all of the non-MDIO control signals tabulated in FIG. 2, except for the performance monitoring sync signal, the programmable control signals (PRG_CNTLx), and the programmable alarm signals (PRG_ALRMx). Thus, the CFP, CFP2, CFP4, and OIF-MSA-100GLH standards share a common set of 6 non-MDIO control signals (TX_DIS, MOD_LOPWR, MOD_RSTn, MOD_ABS, RX_LOS, and GLB_ALRMn).

Typically, the test device supports not only the common set of MDIO and non-MDIO control signals, but most or all of the control signals required by each standard for full control of the DUT, i.e., for control and monitoring of the DUT. In other words, the test device supports the common set, as well as additional control signals required by some standards. Accordingly, in the exemplary embodiment, the test device, preferably, supports all of the control signals of FIG. 2, i.e., all the control signals necessary for full control of DUTs having control interfaces compliant with the CFP, CFP2, CFP4, and OIF-MSA-100GLH standards.

Figure 3:
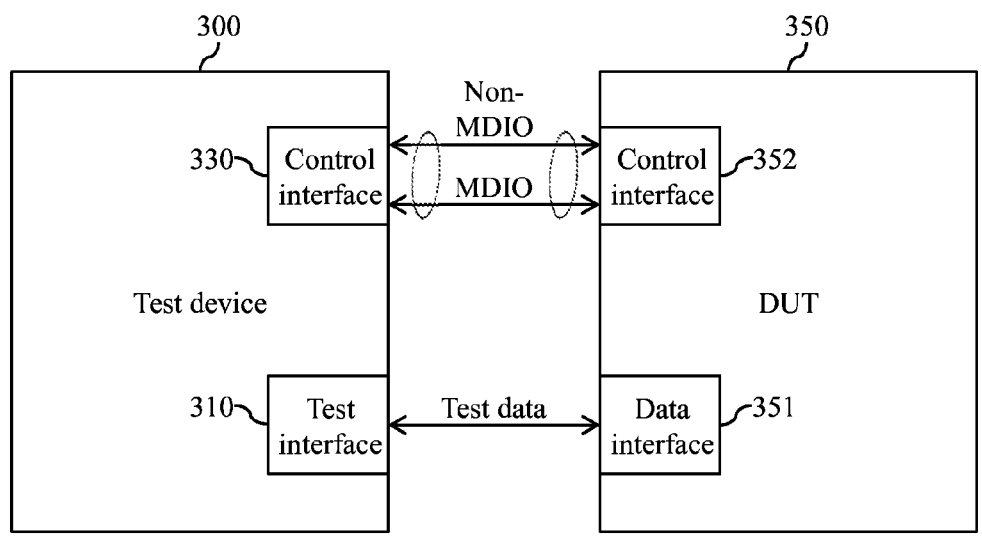
FIG. 3 is a block diagram of a test setup using a first embodiment of a test device according to the present invention.

A test setup including a first embodiment of the test device 300 is illustrated in FIG. 3. The test device 300 includes a test interface 310 and, unlike the conventional test device 100 of FIG. 1, an integrated control interface 330. Typically, the test interface 310 and the control interface 330 of the test device 300 are housed in a common housing. In some instances, the test interface 310 and the control interface 330 may be on a common board. However, the test interface 310 and the control interface 330 are, typically, on separate connectors. The control signals are brought out on an exposed interface to control an external DUT 350.

The DUT 350 is coupled to the test device 300 by coupling a data interface 351 of the DUT 350 to the test interface 310 of the test device 300, and by coupling a control interface 352 of the DUT 350 to the control interface 330 of the test device 300. The DUT 350 is externally connected to the test device 300, i.e., not plugged in, and is physically separate from the test device 300. This arrangement allows the DUT 350 to be placed in a test chamber, e.g., a temperature chamber, and also allows the testing of breadboard assemblies. The data interface 351 of the DUT 350 is externally and directly connected to the test interface 310 of the test device 300. Separately, the control interface 352 of the DUT 350 is externally and directly connected to the control interface 330 of the test device 300.

Advantageously, the control interface 330 is capable of adapting to DUTs 350 having control interfaces compliant with different standards sharing a common set of MDIO and non-MDIO control signals, e.g., the CFP, CFP2, CFP4, and OIF-MSA-100GLH standards, as described in further detail hereafter. As subsets of the control interface 330, an MDIO interface compliant with Clause 45 of IEEE Std 802.3-2012, and a direct control interface, e.g., compliant with the CFP, CFP2, CFP4, and OIF-MSA-100GLH standards, are provided.

The test device 300, via the integrated control interface 330, provides direct and full control of the DUT 350 via at least the common set of MDIO and non-MDIO control signals. Unlike the test setup of FIG. 1, there is no need for an external control device 160 or a conversion device 170 in the test setup of FIG. 3. The integrated control interface 330 can be used in parallel with the test interface 310 or in a standalone fashion. If the control interface 330 and the test interface 310 are used in parallel for a test, the test device 300 can have full control over both the control plane and the data plane during the test.

To perform a test, the test interface 310 of the test device 300 exchanges test data signals with the data interface 351 of the DUT 350. Thereby, test results are obtained. Meanwhile, the control interface 330 of the test device 300 exchanges control signals selected from the common set of MDIO and non-MDIO control signals with the control interface 352 of the DUT 350 to monitor the DUT 350, as explained in further detail hereafter. Thereby, status information about the DUT 350 is obtained. Typically, the test interface 310 and the control interface 330 are internally synchronized, allowing correlation of the status information with the test results.

Figure 4:
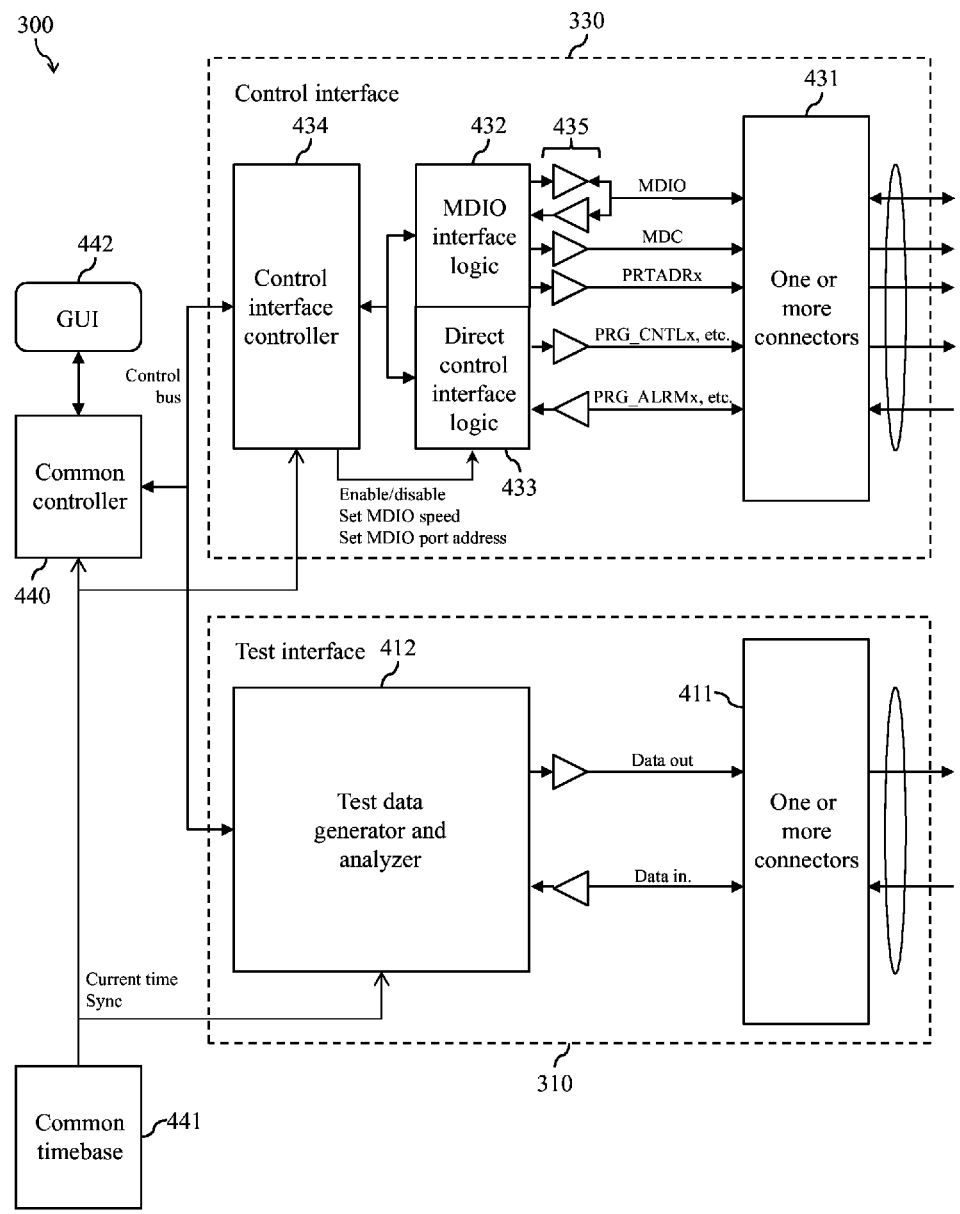
FIG. 4 is a block diagram of an exemplary control architecture for the test device of FIG. 3.

With reference to FIG. 4, an exemplary architecture for the test device 300 includes a common controller 440, a common timebase 441, and a graphical user interface (GUI) 442, in addition to the test interface 310 and the integrated control interface 330. The test device 300 is, generally, implemented as a combination of hardware, firmware, and software.

Typically, at least the common controller 440, the common timebase 441, the test interface 310, and the integrated control interface 330 are housed by a common housing. The common controller 440, e.g., a central processing unit (CPU), runs control software stored in non-volatile memory (not shown). The common controller 440 manages the test interface 310 and the control interface 330, via a control bus, in accordance with user input received from the GUI 442. The common timebase 441, e.g., a clock or a counter, synchronizes the common controller 440, the test interface 310, and the control interface 330 by providing current time information and synchronization signals, e.g., a 100 ms tick.

The test interface 310 includes one or more connectors 411 and a test data generator and analyzer 412. The one or more connectors 411 are used to externally connect the data interface 351 of the DUT 350 to the test interface 310 of the test device 300. The number and type of connectors 411 depend on the type of DUT 350, since the number of lanes and the bit rate per lane varies with the electrical interface, e.g., XL attachment unit interface (XLAUI), CAUI, or CAUI-4, used by the DUT 350. Typically, the one or more connectors 411 are configured to receive one or more cables, e.g., a plurality of microwave coaxial cables or other cables suitable for high-speed signals. Most tests require an electrical or optical loopback, unless the DUT 350 is connected to a remote device. If required, an optical loopback may be installed to connect optical transmit and receive ports of the DUT 350, so that optical test data signals transmitted by the DUT 350 are looped back and received by the DUT 350.

The test data generator and analyzer 412 exchanges test data signals with the data interface 351 of the DUT 350, via the one or more connectors 411. The test data generator and analyzer 412 generates test data signals transmitted to the data interface 351, and analyzes test data signals received from the data interface 351 to obtain test results.

More specifically, the test data generator and analyzer 412 monitors the test data signals received from the DUT 350 and detects anomalies and/or errors. The test data generator and analyzer 412 may perform traffic tests using different types of traffic, such as unframed, physical coding sublayer (PCS), Ethernet, internet protocol (IP), or optical transport network (OTN) traffic. Depending on the protocol layer(s) tested, many different types of anomalies and/or errors may be detected, e.g., bit errors, bit slips, block errors, alignment marker errors, frame check sequence (FCS) errors, lost packets, misinserted packets, frame alignment signal (FAS) errors, multiframe alignment signal (MFAS) errors, and forward error correction (FEC) errors. The test data generator and analyzer 412 time-stamps and logs any anomalies and/or errors. The test data generator and analyzer 412 may also measure and log transfer performance parameters. The test results, including any anomalies, errors, and/or transfer performance parameters, are sent to the common controller 440, stored in non-volatile memory, and displayed via the GUI 442.

The control interface 330 includes one or more connectors 431, an MDIO interface logic block 432, a direct control interface logic block 433, i.e., an input/output (I/O) interface logic block, and a control interface controller 434. As mentioned heretofore, the control interface 330 is an exposed interface, which is capable of cable driving and receiving. Drivers and receivers 435, as well as an input buffer, are provided, in accordance with the MDIO and non-MDIO control signals supported by the test device 300, to improve cable driving and receiving performance. The one or more connectors 431 are used to externally connect the control interface 352 of the DUT 350 to the control interface 330 of the test device 300. Typically, the one or more connectors 431 are configured to receive one or more cables, e.g., a single ribbon-type cable or another cable suitable for low-speed signals.

The control interface controller 434 is a dedicated controller for the control interface 330. Typically, the control interface controller 434 is implemented as a microcontroller, a programmable logic device, e.g., a field-programmable gate array (FPGA), or a combination thereof. The MDIO interface logic block 432, typically, includes a serial to parallel converter, e.g., a serializer/deserializer (SerDes), to convert the MDIO serial data signal to parallel data signals for the control interface controller 434.

As mentioned heretofore, the control interface 330 of the test device 300 is capable of adapting to the standard with which the control interface 352 of the DUT 350 complies. The control interface 330 of the test device 330 may be manually or automatically configured.

In an exemplary method for manual configuration, a user manually inputs the type of DUT 350, i.e., the standard with which the control interface 352 of the DUT 350 complies, via the GUI 442. The user also, typically, inputs the MDIO speed and the MDIO port address. The common controller 440 receives this information from the GUI 442 and forwards the information to the control interface controller 434. The control interface controller 434 then configures the MDIO interface logic block 432 and the direct control interface logic block 433 in accordance with the type of DUT 350. Configuration includes setting the MDIO speed and the MDIO port address, as well as enabling/disabling drivers and receivers 435 in accordance with the type of DUT 350.

In an exemplary method for automatic configuration, the control interface controller 434 automatically detects the type of DUT 350, i.e., the standard with which the control interface 352 of the DUT 350 complies, the MDIO speed, and the MDIO port address. The control interface controller 434 continuously senses the module absent signal (MOD_ABS). When the module absent signal indicates that a DUT 350 is coupled to the control interface 330 of the test device 300, the control interface controller 434 releases the module reset signal (MOD_RSTn) and, after a waiting period, starts trying to access the DUT 350. By scanning all possible MDIO port addresses and by varying the MDIO speed, the control interface controller 434 determines the MDIO port address and the maximum MDIO speed supported, and configures the MDIO interface logic block 432. After having established MDIO connectivity, the control interface controller 434 interrogates MDIO registers in the control interface 352 of the DUT 350. By analyzing data stored in these registers, the control interface controller 434 determines the type of DUT 350. The control interface controller 434 then configures the direct control interface logic block 433 by enabling/disabling the corresponding drivers and receivers 435 in accordance with the type of DUT 350.

Once configured, the control interface 330 of the test device 300 is able to directly and fully control the DUT 350. The control interface controller 434 exchanges MDIO and non-MDIO control signals with the control interface 352 of the DUT 350, via the MDIO interface logic block 432 or the direct control logic block 433, respectively, and the one or more connectors 431. The control interface 330, via the control interface controller 434, generates MDIO control signals internally. In particular, the control interface controller 434 generates read/write command frames for the MDIO serial data signal (MDIO), in order to read/write data from/to registers in the control interface 352 of the DUT 350. The control interface controller 434 also receives read response frames via the MDIO serial data signal. In addition, the control interface controller 434 senses/supplies the input/output direct control signals, i.e., the non-MDIO control signals.

The control interface 330 controls the DUT 350 via output MDIO and non-MDIO control signals. For example, the integrated control interface 330 may reset the DUT 350, initialize the DUT 350, and/or activate/disable the DUT 350.

The control interface 330 also monitors the DUT 350 and, thereby, obtains status information about the DUT 350. The control interface controller 434 continuously senses input non-MDIO control signals to detect any anomalies in the status of the DUT 350. The control interface controller 434 also periodically interrogates the DUT 350 several times a second, e.g., every 100 ms, to retrieve other status information about the DUT 350, e.g., receiver lock status, optical input level, DUT temperature, and/or DUT supply voltage, via MDIO control signals. The control interface controller 434 time-stamps and logs the status information, including any status anomalies. The status information is sent to the common controller 440, stored in non-volatile memory, and displayed via the GUI 442.

When the control interface 330 and the test interface 310 of the test device 300 are used in parallel to perform a test, the control interface controller 434 monitors the DUT 350 throughout the test to obtain status information about the DUT 350, while the test data generator and analyzer 412 obtains test results. The control interface controller 434 also controls the DUT 350 throughout the test. After completion of the test, the common controller 440 receives the status information from the control interface controller 434 and the test results from the test data generator and analyzer 412. By analyzing the associated timestamps, the common controller 440 correlates the status information with the test results. Exemplary correlations include the correlation of bit errors with optical input level, the correlation of bit errors with DUT temperature, and the correlation of frame errors with DUT supply voltage. The correlation results are stored in non-volatile memory and displayed via the GUI 442.

Figure 5:
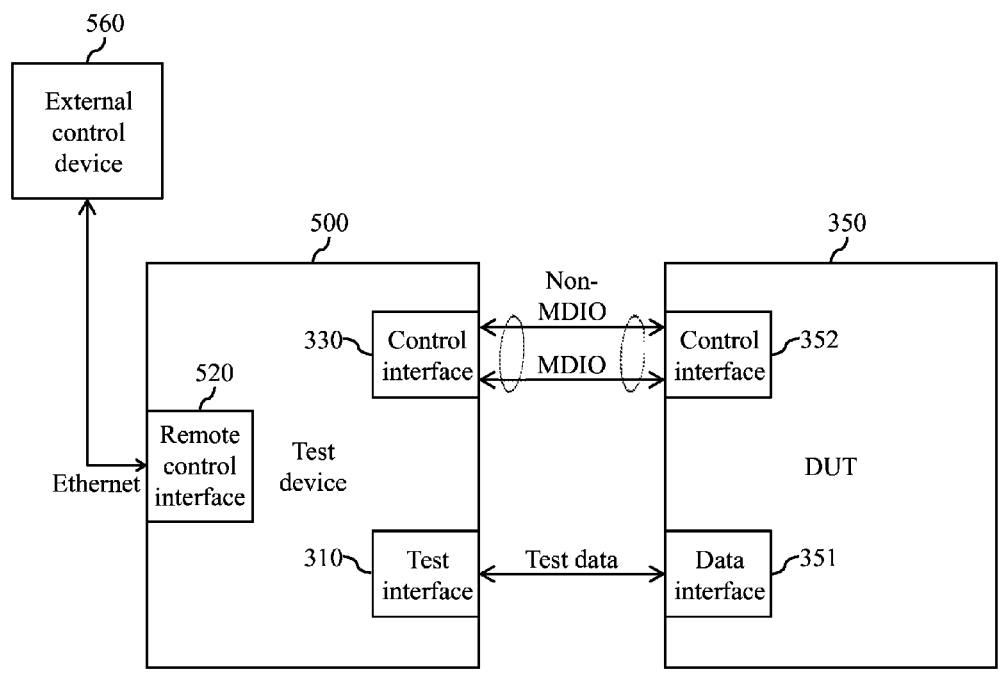
FIG. 5 is a block diagram of a test setup using a second embodiment of a test device according to the present invention.

A test setup including a second embodiment of the test device 500 is illustrated in FIG. 5. The second embodiment of the test device 500 is similar to the first embodiment, but includes a remote control interface 520, in addition to the test interface 310 and the integrated control interface 330. The remote control interface 520, e.g., a standard Ethernet remote control interface, is coupled to an external control device 560, e.g., a computer running control software. This test setup is advantageous when the control software and GUI built-in to the test device 500 do not provide sufficient functionality.

In the exemplary control architecture of FIG. 3, the remote control interface 530 would be coupled to the common controller 440, enabling the common controller 440 to receive commands from the external control device 560 and to send information and results to the external control device 560 for storage and display.

Figure 6:
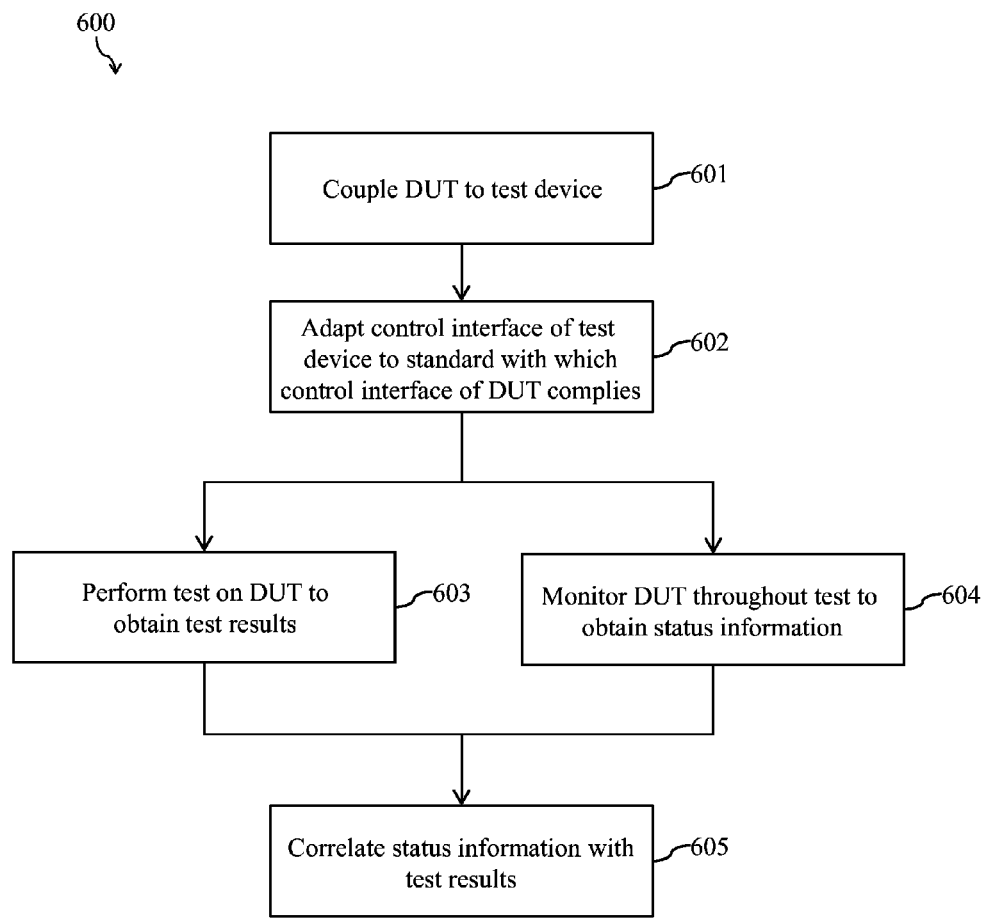
FIG. 6 is a flowchart for a method of testing a device under test (DUT) according to the present invention.

With reference to FIG. 6, the test device of the present invention may be used to carry out a method 600 having general steps 601 to 605. Further details of the method 600 may be found in the description of the test device hereinabove.

In step 601, a DUT having a control interface compliant with a standard selected from a plurality of standards each supporting a common set of MDIO and non-MDIO control signals is coupled to the test device, by coupling a data interface of the DUT to the test interface of the test device, and by coupling the control interface of the DUT to the control interface of the test device. Typically, the DUT is externally connected to the test device, by separately connecting the data interface of the DUT to the test interface of the test device, and the control interface of the DUT to the control interface of the test device.

In step 602, the control interface of the test device is adapted to the standard with which the control interface of the DUT complies, so that the control interface of the test device directly controls the DUT via at least the common set of MDIO and non-MDIO control signals. In some instances, the control interface of the test device automatically detects the standard with which the control interface of the DUT complies and adapts itself to that standard. In other instances, the control interface of the test device is manually configured by a user according to the standard with which the control interface of the DUT complies.

In step 603, a test is performed on the DUT by exchanging test data signals between the data interface of the DUT and the test interface of the test device. Thereby, test results for the DUT are obtained. In parallel, in step 604, the DUT is monitored throughout the test by exchanging control signals selected from the common set of MDIO and non-MDIO control signals between the control interface of the DUT and the control interface of the test device. The test device, typically, both continuously senses non-MDIO control signals and periodically interrogates the DUT via MDIO control signals. Thereby, status information about the DUT is obtained. Usually, the test interface of the test device and the control interface of the test device are synchronized, and the test results and status information are time-stamped according to a common timebase. In step 605, which is optional, the status information is correlated with the test results.

To further illustrate the method of the present invention, an exemplary method of testing the Ethernet traffic handling performance of a CFP2 transponder, i.e., a transponder compliant with the CFP2 standard, is described hereafter.

The CFP2 transponder is first coupled to an exemplary embodiment of the test device supporting control interfaces compliant with the CFP, CFP2, CFP4, and OIF-MSA-100GLH standards. A data interface, e.g., CAUI-4, of the transponder is connected to the test interface of the test device, e.g., via a plurality of coaxial cables, and a control interface of the transponder is connected to the control interface of the test device, e.g., via a single ribbon-type cable. An optical loopback is installed to connect the transmit and receive ports of the transponder.

The control software of the test device is launched either before or after the transponder is connected. Via the control software, the test device is instructed to begin the Ethernet traffic handling test. The test could also be started after configuration and initialization is complete. The control interface of the test device checks for the presence of a DUT by sensing the status of the module absent signal (MOD_ABS). Then the control interface of the test device identifies the standard with which the control interface of the transponder complies, in this instance, the CFP2 standard. The control interface of the test device adapts itself accordingly, so that the control interface is suitably configured to directly and fully control the transponder via the MDIO and non-MDIO control signals supported by the CFP2 standard.

The control interface of the test device resets the transponder by toggling the module reset signal (MOD_RSTn). The transponder is then initialized by writing data to registers in the control interface of the transponder, via the MDIO serial data signal (MDIO). Parameters such as bit rate and operation mode are configured. Before, during, and after initialization, the status of the transponder is monitored, both by sensing the input non-MDIO control signals and by reading data from registers in the control interface of the transponder via the MDIO serial data signal.

The control interface of the test device turns on the transponder's laser by toggling the transmitter disable signal (TX_DIS). The test interface of the test device starts to generate Ethernet traffic with user-set characteristics. The Ethernet traffic is generated in accordance with important traffic parameters such as bandwidth, burst size, and frame size distribution. The test interface sends Ethernet traffic to the data interface of the transponder and receives Ethernet traffic from the data interface of the transponder.

The test interface of the test device monitors the Ethernet traffic received from the data interface of the transponder and detects anomalies and/or errors. Any anomalies and/or errors, e.g., frame check sequence (FCS) errors or lost frames, are time-stamped and logged. The test interface also measures transfer performance parameters for the Ethernet traffic, e.g., packet transfer delay or packet transfer delay variation, which are also logged.

In parallel to the Ethernet traffic monitoring performed by the test interface, the control interface of the test device monitors the transponder. The control interface continuously monitors the non-MDIO control signals received from the control interface of the transponder to detect status anomalies. Any status anomalies are time-stamped and logged. The control interface of the test device also periodically retrieves other status information, e.g., receiver lock status, optical input level, transponder temperature, and/or transponder supply voltage, from the control interface of the transponder via the MDIO serial data signal. The status information is also time-stamped and logged.

After a user-set measurement time has elapsed or by manual intervention, the test is terminated. Final test results and final status information are determined and sent to the common controller of the test device. The common controller correlates the final test results with the final status information by analyzing the associated timestamps. The final test results, the final status information, and the correlation results are displayed, via the GUI of the test device, and stored in non-volatile memory. Another test may be initiated or the transponder may be disconnected from the test device.

Of course, numerous other embodiments may be envisaged without departing from the spirit and scope of the invention.

We claim:

1. A test device for testing a device under test (DUT), the test device comprising:
   a test interface including a test data generator and analyzer that couples to a data interface of the DUT and receives data signals from the DUT during a test; and
   an integrated control interface adaptable for a plurality of communication standards and including a management data input/output (MDIO) interface logic block, wherein the integrated control interface is to:
   couple to a control interface of the DUT;
   adapt to a communication standard, used by the DUT, of the plurality of communication standards;
   exchange MDIO and non-MDIO control signals compliant with the communication standard used by the DUT via the integrated control interface while testing the DUT;
   obtain test data from the DUT to determine test results; and
   obtain status information of the DUT in synchrony with the test data periodically during the test via the exchange.

2. The test device of claim 1, comprising:
   wherein the integrated control interface is to access the DUT via the test interface to determine the communication standard used by the DUT, and adapt the integrated control interface to the determined communication standard.

3. The test device of claim 2, wherein the integrated control interface comprises a control interface controller, and the control interface controller is to interrogate registers in the DUT to determine a type of the DUT, and determine the communication standard used by the DUT from the type.

4. The test device of claim 1, wherein the control interface controller configures a direct control interface logic block of the integrated control interface by enabling or disabling drivers and receivers in accordance with the type of the DUT to adapt to the communication standard used by the DUT.

5. The test device of claim 1, wherein to interrogate registers in the DUT, the control interface controller is to determine a MDIO port address and maximum MDIO speed supported by the DUT, and configure logic of the integrated control interface according to the determined MDIO port address and maximum MDO speed to establish MDIO connectivity with the DUT, wherein the registers in the DUT are interrogated after establishing MIDO connectivity.

6. The test device of claim 5, wherein to determine the MDIO port address and the maximum MDO speed, the control interface controller senses a module absent signal (MOD_ABS) that indicates the DUT is coupled to the control interface, and the control interface controller releases a module reset signal (MOD_RSTn) and, after a waiting period, scans possible MDIO port addresses and varies an MDIO speed until the MDIO port address and the maximum MDIO speed are determined.

7. The test device of claim 6, wherein the control interface controller sets the MDIO port address and the maximum MDIO speed in a direct control interface logic block of the integrated control interface.

8. The test device of claim 1, wherein the exchange of the MDIO and non-MDIO control signals by the integrated control interface enables the integrated control interface to at least one of reset the DUT, initialize the DUT, activate the DUT and disable the DUT during the test.

9. The test device of claim 1, further comprising:
a common controller that controls the test interface and the integrated control interface via a control bus in accordance with user input received from a graphical user interface (GUI); and
a common timebase that synchronizes the common controller, the test interface and the integrated control interface by providing current time information and synchronization signals.

10. A test device operative to test a device under test (DUT), the test device comprising:
at least one connector;
a test interface including a test data generator and analyzer, wherein the test interface couples to a data interface of the DUT, and the test data generator and analyzer receives data signals from the DUT including results of a test;
interface logic coupled to a control interface of the DUT via the at least one connector and adaptable to a plurality of communication standards; and
a control interface controller to adapt the interface logic to be compliant with a communication standard used by a DUT connectable to the test device via the at least one connector,
wherein the interface logic is to exchange management data input/output (MDIO) and non-MDIO control signals with the DUT via the at least one connector during the test of the DUT to determine status information of the DUT periodically and the interface logic is to receive test data from the DUT to determine results of the test such that the status information is received in synchrony with the test data.

11. The test device of claim 10, wherein the each of the plurality of communication standards supports a common set of MDIO and non-MDIO control signals, and the test device is to perform a test of the DUT by exchanging control signals selected from the common set of MDIO and non-MDIO control signals of the communication standard used by the DUT.

12. The test device of claim 11, wherein the control interface controller is to interface directly and fully control the DUT via parallel usage of the test interface and the interface logic of the test device during the test.

13. The test device of claim 10, wherein the control interface controller is to interrogate registers of the DUT to determine a type of the DUT, wherein the communication standard used by the DUT is determined from the type.

14. The test device of claim 10, wherein control interface controller is to determine a MDIO port address and a maximum MDIO speed supported by the DUT, and configure the interface logic to the determined MDIO port address and the maximum MDO speed to establish MDIO connectivity with the DUT.

15. A testing method executed by a test device, the testing method comprising:
determining, by the test device, a communication standard used by a device under test (DUT);
adapting, by the test device, a control interface of a test device to the communication standard used by the DUT, wherein the control interface of the test device is coupled to a control interface of the DUT, and the control interface of the test device is adaptable to a plurality of communication standards;
exchanging, by the test device, test data signals with the DUT via a data interface of the DUT and a test interface of the test device to test the DUT;
exchanging, by the test device, management data input/output (MDIO) and non-MDIO control signals compliant with the communication standard used by the DUT, with the DUT via the control interface when monitoring the DUT during the test;
determining, by the test device, results of the test based on the exchanging of the test data signals; and
determining, by the test device, status information of the DUT periodically during the test in synchrony with the test data signals, wherein the status information is based on the exchanging of the MDIO and non-MDIO control signals.

* * * * *